United States Patent
Takeuchi et al.

(10) Patent No.: US 6,879,613 B2
(45) Date of Patent: Apr. 12, 2005

(54) LASER DIODE, OPTICAL PICKUP DEVICE, OPTICAL DISK APPARATUS, AND OPTICAL COMMUNICATIONS EQUIPMENT

(75) Inventors: Kanji Takeuchi, Tokyo (JP); Kenji Sahara, Kanagawa (JP)

(73) Assignee: Sony Corporation, Tokyo (JP)

( * ) Notice: Subject to any disclaimer, the term of this patent is extended or adjusted under 35 U.S.C. 154(b) by 329 days.

(21) Appl. No.: 10/187,480

(22) Filed: Jul. 2, 2002

(65) Prior Publication Data

US 2003/0031220 A1 Feb. 13, 2003

(30) Foreign Application Priority Data

Jul. 5, 2001 (JP) .................................... P2001-205306

(51) Int. Cl.[7] .............................................. H01S 5/00
(52) U.S. Cl. ............................ 372/45; 372/43; 372/44; 372/46; 372/47; 372/48; 372/49; 372/50
(58) Field of Search ...................................... 372/43–50

(56) References Cited

U.S. PATENT DOCUMENTS

| | | | | |
|---|---|---|---|---|
| 5,559,819 A | * | 9/1996 | Abe et al. | 372/46 |
| 5,937,120 A | * | 8/1999 | Higashi | 385/49 |
| 6,118,799 A | * | 9/2000 | Okubo et al. | 372/46 |
| 6,195,375 B1 | * | 2/2001 | Hirata | 372/46 |
| 6,333,945 B1 | * | 12/2001 | Abe et al. | 372/46 |
| 6,606,334 B1 | * | 8/2003 | Shigihara et al. | 372/45 |

FOREIGN PATENT DOCUMENTS

| | | |
|---|---|---|
| JP | 4290280 | 10/1992 |
| JP | 5251813 | 9/1993 |
| JP | 5275798 | 10/1993 |
| JP | 7240560 | 9/1995 |
| JP | 1330540 | 11/1999 |
| JP | 2003023214 | * 1/2003 |

* cited by examiner

*Primary Examiner*—Min Sun Harvey
*Assistant Examiner*—Delma R. Flores-Ruiz
(74) *Attorney, Agent, or Firm*—Sonnenschein, Nath & Rosenthal LLP

(57) ABSTRACT

A laser diode capable of reducing a radiating angle $\theta\perp$ in the vertical direction, an optical pickup device, an optical disk apparatus, and optical communications equipment, all equipped with the laser diode which increases optical coupling efficiency. It has a first cladding layer of the first conductive type formed on a substrate, with an active layer on top of the first cladding layer and a second cladding layer of the second conductive type on top of the active layer. In at least the first or second cladding layer, it is formed of at least one optical guide layer having a higher refractive index than the first or second cladding layer and operating to expand a beam waist in the waveguide. This operation contributes to widening a region in which to shut up light, enabling a radiating angle $\theta\perp$ in the vertical direction to be reduced.

29 Claims, 10 Drawing Sheets

LASER DIODE, OPTICAL PICKUP DEVICE, OPTICAL DISK APPARATUS, AND OPTICAL COMMUNICATIONS EQUIPMENT

CROSS REFERENCES TO RELATED APPLICATIONS

The present document is based on Japanese Priority Document JP 2001-205306, filed in the Japanese Patent Office on Jul. 5, 2001, the entire contents of which being incorporated herein by reference.

BACKGROUND OF THE INVENTION

1. Field of the Invention

The present invention relates to a laser diode, an optical pickup device, an optical disk apparatus, and optical communications equipment, and more particularly to a laser diode which can reduce a radiation angle $\theta\bot$ of a laser beam in the vertical direction, and an optical pickup device, an optical disk apparatus, and optical communications equipment employing a laser diode for their respective light-emitting units.

2. Description of the Related Art

In general, a laser diode used in an optical disk apparatus such as a CD (compact disk) and a DVD (digital versatile disk) or an optical pickup device built therein or optical communications equipment is of the stripe structure.

FIG. 10 shows a cross-sectional view of a conventional laser diode. For example, on an n-type substrate 10, there are laminated, for example, an n-type cladding layer 11 constituted by $Al_{0.5}Ga_{0.5}As$, and an active layer, which includes an upper layer of a quantum well structure composed of a well layer and a barrier layer and a lower layer of an SCH (Separated Confinement Hetero) optical guide layer, and which is, for example p-type first cladding layers 13, 15 constituted by $Al_{0.5}Ga_{0.5}As$, whereas a p-type optical guide layer 14 constituted by $Al_{0.3}Ga_{0.7}As$ is formed on the border with the p-type first cladding layers 13, 15.

At a current injecting stripe region, the p-type first cladding layer 15 and the p-type optical guide layer 14 are processed in the shape of a ridge. At both sides of the current injecting stripe region, there is laminated on the p-type first cladding layer 13, for example, a n-type current block layer 16 constituted by $Al_{0.5}Ga_{0.5}As$.

On the p-type first cladding layer 15 and the n-type current block layer 16, there are laminated p-type second cladding layers 17, 18 of the embedded type constituted by $Al_{0.55}Ga_{0.45}As$, and, a p-type contact layer 19 constituted by GaAs is formed further on of these layers.

A p-electrode 20 is formed covering the p-type contact layer 19 to make an ohmic contact, and an n-electrode 21 is formed covering the bottom of the n-type substrate 10 to make an ohmic contact.

In the structure described above, the p-type optical guide layer 14 is a film that operates as an etching stopper as well, whereby, in the process of making the p-type optical guide layer 14 and the p-type first cladding layer 15 into a ridge shape, etching is once suspended on the surface of the p-type optical guide layer 14, so that the etching conditions are altered or the etching time is controlled to process up to and including the p-type optical guide layer 14, thus obtaining the ridge shape.

A laser diode of a conventional construction described above has an inherent constraint that transverse mode must be stabilized to restrict the generation of a kink. Stabilization is typically achieved by restricting a higher mode of the transverse mode, which calls for restraining the current field from expanding, thus necessitating to position the p-type optical guide layer 14 as close as possible to the active layer 12. For example, a distance between the p-type optical guide layer 14 and the active layer 12 is set on the order of 0.2 to 0.3 $\mu m$.

Nonetheless, in a conventional laser diode of the foregoing construction, there is a problem stemming from its structural constraint, that is, a radiant angle $\theta\bot$ in the vertical direction of a laser beam growing larger than a radiant angle $\theta//$ in the horizontal direction.

The reason for the radiant angle $\theta\bot$ in the vertical direction of laser beam becoming larger than the radiant angle $\theta//$ in the horizontal direction thereof is as follows: light is enclosed in the vertical direction related to the $\theta\bot$ in a extremely thin region on the order of several hundred nm, which is a dimension of a thickness of the active layer, in contrast to light enclosed in the horizontal direction related to the $\theta//$ in a width of a few $\mu m$, which is a dimension of a stripe width, hence, when light is radiated as a laser beam, a strong diffraction in the vertical direction occurs in comparison with the horizontal direction.

As is apparent from the foregoing, positioning the p-type optical guide layer 14 in FIG. 10 closer to the active layer 12 to stabilize transverse mode causes light in the vertical direction to be enclosed more and more in the vicinity of the active layer and further causes the NFP (near field pattern) to become flatter and flatter in shape, while the FFP (far field pattern) which is its Fourier transform expands more and more in the vertical direction, thus enlarging the $\theta\bot$.

The growth of $\theta\bot$ in optical communications equipment mounted with a conventional laser diode produces a disadvantageous effect of a significant drop in coupling efficiency with transmission media such as an optical fiber as well as coupling efficiency with an optical system such as an optical pickup device. Consequently, when a conventional laser diode is used for an optical disk apparatus such as a CD-R/RW that requires a high-speed write operation, any component not conducive to optical coupling becomes a loss, so that the output requirement of the laser diode grows higher and higher.

Further, when it is used as a high-power laser for other purposes, too, it is preferable that the loss be decreased by improving optical coupling efficiency.

As conventional methods of reducing the $\theta\bot$, there is known a method of decreasing a difference of refractive index between the active layer and the cladding layer or a method of making the film thickness of the active layer thin. However, these methods decrease a volume of the active layer, causing a gain to be insufficient, hence, an increase in a threshold current or an increase in an operating current may be induced.

Still further, Japanese Patent Application Publication (KOKAI) No. HEI 6-104525 contains a disclosure of another known method of regulating the radiating angle by varying a refractive index distribution in the vicinity of the active layer. Nevertheless, regulating the refractive index in the vicinity thereof means that a portion in which the refractive index is lowered by varying a composition ratio of Al acts as a barrier to the behavior of a carrier thus to make it difficult for a current to be injected into the active layer, thereby causing problems such as an increase in the operating current.

In this manner, in the currently available technology, difficulty of reducing the $\theta\bot$ bring limits in flexibility of laser design.

The present invention is directed to resolving the current circumstances. Accordingly, the present invention provides a laser diode capable of reducing a radiant angle θ⊥ without generating any new problem described above, an optical pickup device, an optical disk apparatus, and optical communications equipment, all provided with a laser diode of the present invention to improve optical coupling efficiency.

SUMMARY OF THE INVENTION

A laser diode of the present invention comprises a first cladding layer of a first conductive type formed on a substrate, an active layer formed on the first cladding layer, and a second cladding layer of a second conductive type formed on the active layer, whereas one or more layers of an optical guide layer having a higher refractive index than the first cladding layer or second cladding layer and operating to broaden a beam waist in a waveguide are formed in at least the first cladding layer or the second cladding layer.

It is preferable that, in the laser diode of the present invention, the optical guide layer is formed in the first cladding layer, and that, as the optical guide layer, a plurality of optical guide layers are formed in the first cladding layer.

In the laser diode of the present invention, it is preferable that the optical guide layer is formed in the second cladding layer, and it is more preferable that the second cladding layer has a ridge shape portion, and that the optical guide layer is formed on the ridge shape portion of the second cladding layer as well.

Further, it is preferable that, as the optical guide layer, a plurality of optical guide layers are formed in the second cladding layer, and is more preferable that the second cladding layer has a ridge shape portion, and at least either one of the plurality of optical guide layers is formed on the ridge shape portion of the second cladding layer.

It is preferable that the laser diode of the present invention has, as the optical guide layer, one or more optical guide layers formed in the first cladding layer and one or more optical guide layers formed in the second cladding layer.

Still further, it is preferable that, as the optical guide layer, a plurality of optical guide layers are formed in the first cladding layer.

Furthermore, it is preferable that the second cladding layer has a ridge shape portion, and the optical guide layer formed in the second cladding layer is formed on the ridge shape portion thereof.

Moreover, it is further preferable that, as the optical guide layer, a plurality of optical guide layers are formed in the second cladding layer, the second cladding layer also having a ridge shape portion, at least either one of the plurality of optical guide layers formed therein being formed on the ridge shape portion thereof.

The laser diode of the present invention has a distance from the optical guide layer to the active layer of three times or more than an oscillation wavelength of the laser diode in a medium.

In addition, it is preferable that the second cladding layer has a ridge shape portion, both sides of which are formed of a current block layer.

Further, it is preferable that the active layer includes a quantum well structure comprising a well layer, a barrier layer, and an SCH (Separated Confinement Hetero) optical guide layer formed on the first cladding layer side and on the second cladding layer side of the quantum well structure.

The laser diode of the present invention meets the following equation (1) where $n_0$ is a refractive index of the first or the second cladding layer, $n_1$ is a refractive index of the optical guide layer, and $d_1$ is a film thickness:

$$(n_1/n_0) - 1 \geq 1/d_1 \quad (1)$$

The laser diode of the present invention comprises the first to the j-th optical guide layers being formed in the first or the second cladding layer as the plurality of optical guide layers, the following equation (2) being satisfied, where $n_0$ is a refractive index of the first or the second cladding layer, $n_1$ is a refractive index of the i-th optical guide layer in the plurality of the first to the j-th optical guide layers formed in the first or the second cladding layer, and $d_1$ is a film thickness.

Further, refractive indexes in the first or the second cladding layer including the first to the j-th optical guide layers are gradually distributed:

$$\sum_{i=1}^{j} ((n_i/n_0) - 1) \times d_i \geq 1 \quad (2)$$

In the laser diode of the present invention, it is preferable that the first cladding layer is of the n-type and the second cladding layer is of the p-type, or that the first cladding layer is of the p-type and the second cladding layer is of the n-type.

Further, it is preferable that the Al composition ratios of the barrier layer in the active layer, the SCH optical guide layer, and the optical guide layer operating to broaden a beam waist in the waveguide are virtually equal.

The laser diode of the present invention preferably comprises another optical guide layer having a higher refractive index than the second cladding layer, bringing about virtually no operation to broaden a beam waist in the waveguide, the optical guide layer being further formed in the second cladding layer.

Also, it is preferable that a distance from the active layer of the optical guide layer to the current block layer is less than a distance from the active layer to the optical guide layer bringing about virtually no operation to broaden a beam waist in the waveguide.

In the laser diode of the present invention, there is formed in at least the first cladding layer or the second cladding layer one or more optical guide layers having a refractive index higher than the first cladding layer or the second cladding layer and having an anti-waveguide operation, that is, operating to broaden a beam waist in the waveguide.

By means of operation to broaden a beam waist in the waveguide brought about by the optical guide layer, a region confining a beam therein is expanded, thereby expanding the near field pattern in the vertical direction, while its Fourier transform or the far field pattern is restrained from expanding in the vertical direction, thus causing a radiating angle θ⊥ in the vertical direction to be reduced.

Further, an optical pickup device of the present invention comprises a laser diode having, as a light-emitting unit transmitting light for irradiating an optical recording layer of an optical recording medium, a first cladding layer of the first conductive type formed on a substrate, an active layer formed on the first cladding layer, and a second cladding layer of the second conductive type formed on the active layer, wherein one or more optical guide layers having a higher refractive index than the first cladding layer or the second cladding layer and operating to broaden a beam waist in the waveguide are formed in at least the first cladding layer or the second cladding layer.

Still further, an optical disk apparatus of the present invention comprises a laser diode including, as a light-emitting unit transmitting an optical light for irradiating an optical recording layer of an optical recording medium which is revolvingly driven, a first cladding layer of a first conductive type formed on a substrate, an active layer formed on the first cladding layer, and a second cladding layer of the second conductive type formed on the active layer, wherein one or more optical guide layers having a refractive index higher than the first cladding layer or the second cladding layer and operating to broaden a beam waist in the waveguide are formed in at least the first cladding layer or the second cladding layer.

Furthermore, optical communications equipment of the present invention is optical communications equipment which has at least a light-emitting unit transmitting light and an optical transmission system optically connected to the light-emitting unit. The equipment comprises a laser guide including, as the light-emitting section, a first cladding layer of the first conductive type formed on a substrate, an active layer formed on the first cladding layer, and a second cladding layer of the second conductive type formed on the active layer, wherein one or more optical guide layers having a higher refractive index than the first cladding layer or the second cladding layer and operating to broaden a beam waist in the waveguide are formed in at least the first cladding layer or the second cladding layer.

Moreover, an optical pickup device, an optical disk apparatus, and optical communications equipment of the present invention as described above comprise a laser diode including, as the light-emitting unit, a first cladding layer of the first conductive type formed on a substrate, an active layer formed on the first cladding layer, and a second cladding layer of the second conductive type formed on the active layer, wherein one or more optical guide layers having a higher refractive index than the first cladding layer or second cladding layer and operating to broaden a beam waist in the waveguide are formed in at least the first cladding layer or the second cladding layer.

In this manner, a radiating angle θ⊥ in the vertical direction of the laser diode is reduced and its optical coupling efficiency is improved.

DETAILED DESCRIPTION OF THE PREFERRED EMBODIMENTS

Embodiments of a laser diode, an optical pickup device, an optical disk apparatus, and optical communications equipment according to the present invention will now be described with reference to the accompanying drawings.

First Embodiment

Figure 1:
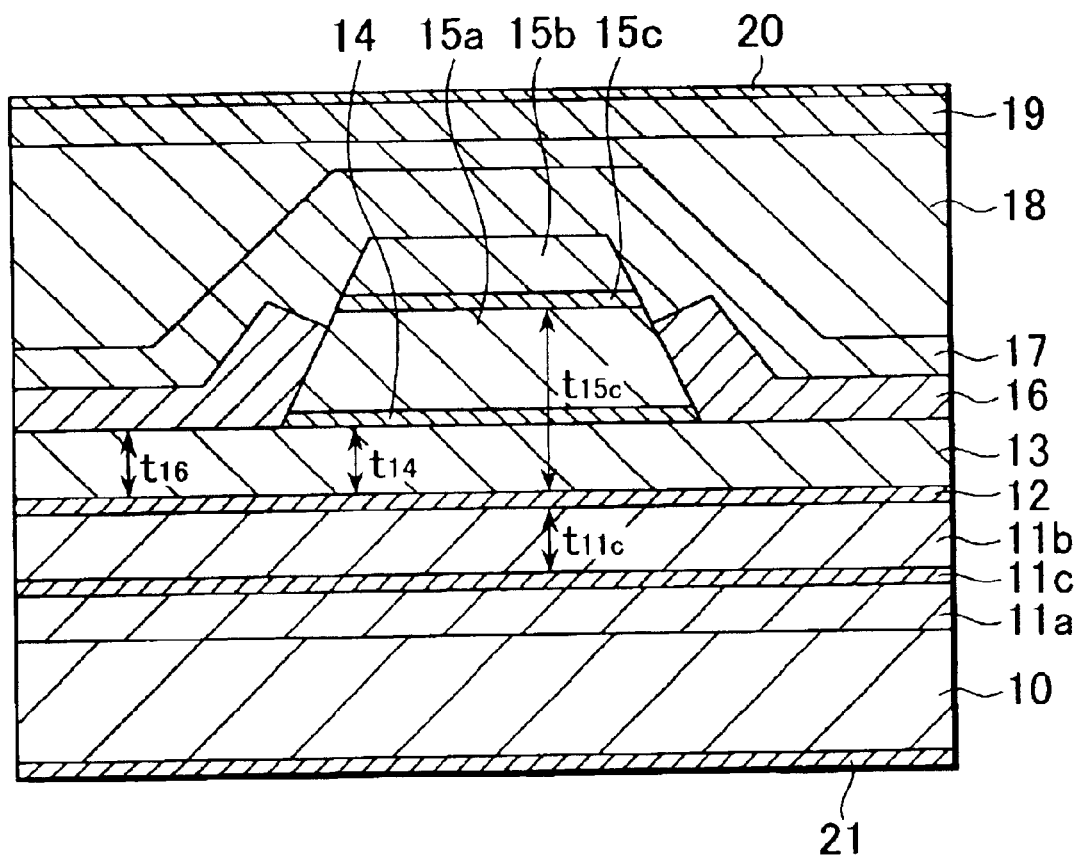
FIG. 1 is a cross-sectional view of a laser diode of a first embodiment according to the present invention.

A laser diode of the present embodiment is, for example, a laser diode of a light-emitting wavelength of 780 nm for a CD-R/RW. FIG. 1 is a cross-sectional view of the laser diode. For example, on an n-type substrate 10 constituted by GaAs, there are laminated, for example, n-type cladding layers 11a, 11b constituted by $Al_{0.5}Ga_{0.5}As$, an active layer 12 having a quantum well structure consisting of a well layer and a barrier layer, with a lamination of an SCH (Separated Confinement Hetero) optical guide layer on and under the quantum well structure, and, for example, p-type first cladding layers constituted by $Al_{0.5}Ga_{0.5}As$ 13, 15a, 15b, whereas there is formed, for example, a p-type first optical guide layer 14 constituted by $Al_{0.3}Ga_{0.7}As$ on the border of the p-type first cladding layers 13 and 15.

Further, on the border of the n-type cladding layers 11a and 11b, there is formed, for example, an n-type optical guide layer 11c constituted by $Al_{0.3}Ga_{0.7}As$, and on the border of the p-type first cladding layers 15a, 15b, there is formed, for example, a p-type second optical guide layer 15c constituted by $Al_{0.3}Ga_{0.7}As$.

At a current injecting stripe region, the p-type first cladding layers 15a, 15b, the p-type second optical guide layer 15c, and the p-type first optical guide layer 14 are processed in the shape of a ridge.

On both sides of the current injecting stripe region, there is laminated, for example, an n-type current block layer 16 constituted by $Al_{0.5}Ga_{0.5}As$ on the p-type first cladding layer 13. On the p-type first cladding layer 15b and the n-type current block layer 16, there is laminated, for example, p-type second cladding layers 17 and 18 of an embedded type constituted by $Al_{0.55}Ga_{0.45}As$, and further thereon, there is formed a p-type contact layer 19 constituted by GaAs.

A p-electrode 20 is formed covering the p-type contact layer 29 to make an ohmic contact, and an n-electrode 21 is formed covering the bottom of an n-type substrate 10 to make an ohmic contact.

The active layer 12 includes, for example, a quantum well structure of a well layer constituted by a well layer of $Al_{0.1}Ga_{0.9}As$ and a barrier layer constituted by $Al_{0.3}Ga_{0.7}As$, and an SCH optical guide layer, constituted by $Al_{0.3}Ga_{0.7}As$, which is formed on the n-type cladding layer side and on the p-type cladding layer side of the quantum well structure.

The active layer 12 may not be of the quantum well structure but may be a bulk active layer.

In the laser diode of the present embodiment, when a preset voltage is applied upon the p-electrode 20 and the n-electrode 21, a current, while being squeezed by the current block layer 16, is fed to the active layer 12, causing a laser beam to radiate from the active layer 12.

In the laser diode of a construction described above, a comparison of a stripe region oscillating a laser beam with other regions shows that the refractive index is higher inside the stripe region so as to provide a laser diode of the refractive index waveguide type which secured a refractive index difference (Δn).

The Δn is produced by the refractive index of a ridge structure including the p-type first optical guide layer 14 or the refractive index of the current block layer 16, and specifically, it is controlled by forming the p-type first optical guide layer 14 having a high refractive index only on the stripe region, or by forming the current stop layer 16 to be formed outside the stripe region with a low refractive index member.

In the construction, an n-type optical guide layer 11c formed on the border of the n-type cladding layers 11a, 11b and a p-type second optical guide layer 15 formed on the border of the p-type first cladding layers 15a, 15b, respectively, having higher refractive indexes than the n-type cladding layer or the p-type cladding layer, are layers that produce anti-waveguide operation, that is, operation to broaden a beam waist in the waveguide.

By means of the operation to broaden a beam waist in the waveguide of the optical guide layers 11c, 15c, the region confining a beam therein is broadened in the vertical direction, thus broadening the near field pattern in the vertical direction. As a result, the far field pattern which is obtained by Fourier transformation of the near field pattern is restrained from broadening in the vertical direction, so that the radiation angle $\theta\perp$ in the vertical direction is reduced relatively with respect to the radiation angle $\theta//$ in the horizontal direction.

Operation of the optical guide layers 11c, 15c to broaden a beam waist in the waveguide, to expand the region confining a beam therein, and to restrain the far field pattern from broadening in the vertical direction calls for setting distances $t_{11c}$, $t_{15c}$ of the optical guide layers 11c, 15c from the active layer 12 in excess of the preset value. For example, it is preferable to set the distance three times or more than the oscillation wavelength of the laser diode in a medium.

Conversely, to obtain sufficient effects, there are limits to the distance between the optical guide layer and the active layer. For example, it is on the order of 1.0 $\mu$m.

As described above, by reducing $\theta\perp$, that is, by lowering the aspect ratio of a laser beam, it is possible, in optical communications equipment in which the laser diode is mounted, to improve the coupling efficiency with a transmission medium such as an optical fiber and the coupling efficiency with an optical system such as an optical pickup device, therefore any loss component not conducive to optical coupling can be reduced.

For example, this is well suited to a case where the laser diode is used for an optical disk apparatus such as a CD-R/RW requiring a high-speed write operation. High-speed recording or high-speed long distance communications may be feasible in low power consumption by using lenses of low NA values.

Further, broadening a beam field in the vicinity of the radiating edge surface of the laser diode delivers effects of reducing the edge surface optical density and restraining the COD (Catastrophic Optical Damage).

If the reduction of the aspect ratio of a laser beam results in a value nearer than the preset value, no operation to broaden a beam waist in the waveguide is virtually brought about; rather, the region confining a beam therein is caused to be narrow, whereby the near field pattern is narrowed in the vertical direction, while the far field pattern is broadened in the vertical direction, thus enlarging the radiation angle $\theta\perp$ in the vertical direction.

Take, for example, the p-type first optical guide layer 14, which is positioned at a distance of approximately 0.2–0.3 $\mu$m from the active layer 12, causing virtually no operation to broaden a beam waist in the waveguide. However, the p-type first optical guide layer 14 restrains the expansion of the current field, controlling a high dimension mode of transverse mode and enabling generation of a kink to be controlled. This makes it possible to restrain an ineffective current and a low threshold current laser is produced.

Still further, although a distance $t_{16}$ from the active layer 12 to the current block layer 16 and a distance $t_{14}$ from the active layer 12 to the p-type first optical guide layer 14 are illustrated to be equal, it is preferable that the distance $t_{16}$ from the active layer 12 to the current block layer 16 be less than the distance $t_{14}$ from the active layer 12 to the p-type first optical guide layer 14 by making the p-type first cladding layer 13 into a thin film on both sides of the current injecting stripe region.

It is also preferable that the following equation (1) be satisfied where $n_0$ is the refractive index of the n-type or p-type cladding layer, $n_1$ is the refractive index of the n-type optical guide layer or the p-type second optical guide layer, and $d_1$ is the film thickness.

Further, in a case of setting up an optical guide layer which operates to broaden a beam waist in the waveguide in both the n-type cladding layer and the p-type cladding layer, it is preferable that the following equation (1) be satisfied for each of the layers. This enables the operation to broaden a beam waist in the waveguide to be sufficiently produced, making it possible to reduce the radiation angle $\theta\perp$ in the vertical direction effectively.

$$(n_1/n_0)-1 \geq 1/d_1 \tag{1}$$

In the laser diode of the present embodiment, there is set up an optical guide layer which operates to broaden a beam waist in a layer of waveguide each for the n-type cladding layer and the p-type cladding layer. Nevertheless, there may be set up a plurality of optical guide layers operating to broaden a beam waist in the waveguide in either of the n-type cladding layer or the p-type cladding layer.

Moreover, a plurality of optical guide layers which operate to broaden a beam waist in the wave-guide in both layers may be set up. In this instance, as the n-type or the p-type optical guide layer operating to broaden a beam waist in the waveguide, the optical guide layers from the first to the j-th are formed in the n-type or the p-type cladding layer, whereas it is preferable that the following equation (2) be satisfied, where $n_0$ is the refractive index of the n-type or the p-type cladding layer, $n_1$ is the refractive index of the i-th optical guide layer of the optical guide layers from the first to the j-th which are formed in the n-type or the p-type cladding layer, operating to broaden a beam waist in the wave guide, and $d_1$ is the film thickness.

Further, when there are set up a plurality of optical guide layers which operate to broaden a beam waist in the waveguide in both the n-type cladding layer and the p-type cladding layer, it is preferable that the following equation (1) is satisfied for each of the layers. This enables the operation to broaden a beam waist in the waveguide to be sufficiently brought about, making it possible to reduce the radiation angle $\theta\perp$ in the vertical direction effectively.

$$\sum_{i=1}^{j} ((n_i/n_0)-1) \times d_i \geq 1 \tag{2}$$

Still further, as described above, in a case where a plurality of optical guide layers operating to broaden a beam waist in the waveguide are set up in the n-type cladding layer, the p-type cladding layer and the like, the refractive indexes in the cladding layers including a plurality of optical guide layers operating to broaden a beam waist in the waveguide may be gradually distributed.

A method of forming a laser diode according to the present embodiment will be described.

First, according to an epitaxial growth method such as the Metal Organic Vapor Phase Epitaxy (MOVPE), for example, on a n-type substrate 10 constituted by GaAs, there are laminated in sequence, for example, a n-type cladding layer 11a constituted by $Al_{0.3}Ga_{0.7}As$, for example, an active layer 12 in which an SCH optical guide layer on and below a quantum well structure comprising a well layer and a barrier layer, a p-type first cladding layer 13 constituted by $Al_{0.5}Ga_{0.5}As$, a p-type first optical guide layer 14 constituted by $Al_{0.3}Ga_{0.7}As$, a p-type first cladding layer 15a constituted by $Al_{0.5}Ga_{0.5}As$, a p-type second optical guide layer 15c constituted by $Al_{0.3}Ga_{0.7}As$, and, a p-type first cladding layer 15b constituted by $Al_{0.5}Ga_{0.5}As$. Composition of each layer may be varied as far as it is appropriate and preferable for each layer.

The next step consists of subjecting the p-type optical guide layer 14 to etching as an etch stopper also, while protecting with a mask a region yet to become a current injection stripe, stopping etching once on the surface of the p-type optical guide layer 14 or altering etch conditions or controlling etch time to process through the p-type optical guide layer 14 and obtaining a ridge shape.

Subsequently, on both sides of the current injecting stripe region, there is formed on the top layer of the p-type first cladding layer 13, the n-type current block layer 16 constituted by $Al_{0.5}Ga_{0.5}As$. Then, on the p-type first cladding layer 15b and the n-type current block layer 16, there are laminated, for example, p-type second cladding layers of the embedded type 17, 18 constituted by $Al_{0.55}Ga_{0.45}As$ and a p-type contact layer 19 constituted by GaAs.

After a p-electrode 20 is formed on the p-type contact layer 19, an n-electrode 21 is formed at the bottom of the n-type substrate 10. After the pelletizing process, a laser diode is produced as shown in FIG. 1.

In the manufacturing process of the laser diode according to the present embodiment, it is possible to simply set up manufacturing conditions by taking the barrier layer of the active layer 12, the SCH optical guide layer, and the optical guide layers 14, 15c, respectively, as $Al_{0.3}Ga_{0.7}As$ and equalizing the composition ratios of Al. Also, manufacturing can be rendered without equalizing these composition ratios.
Second Embodiment A laser diode of the present embodiment is, for example, a laser diode for a CDR/RW of a light-emitting wavelength of 780 nm.

Figure 2:
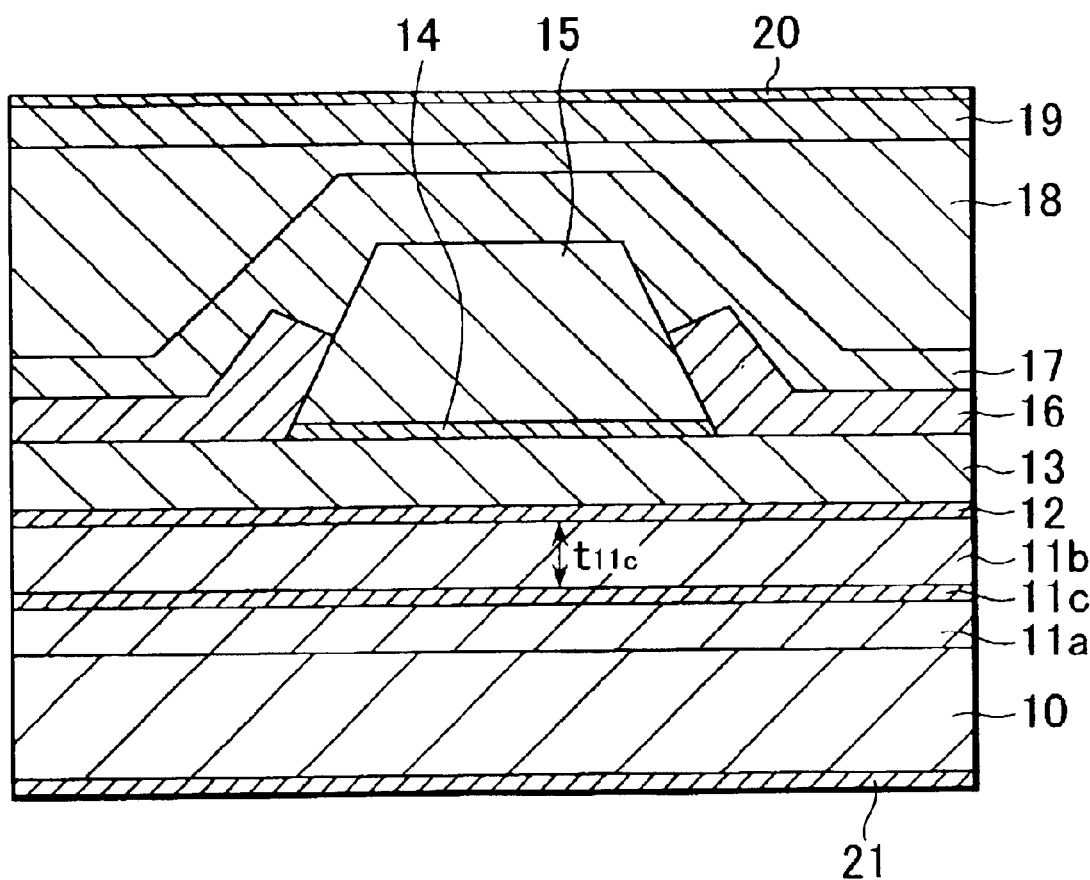
FIG. 2 is a cross-sectional view of a laser diode of a second embodiment according to the present invention.

FIG. 2 shows a cross-sectional view of the laser diode. It is virtually the same as the laser diode of a first embodiment, whereas, as an optical guide layer operating to broaden a beam waist in the waveguide, an n-type optical guide layer 11c is formed on the boundary of n-type cladding layers 11a, 11b, and on the p-type cladding layer side, there is formed only an optical guide layer (p-type optical guide layer 14) which does not operate to broaden a beam waist in the waveguide.

Namely, by means of the operation of the optical guide layer 11c to broaden a beam waist in the waveguide, a region confining a beam therein is expanded in the vertical direction, whereby the near field pattern is expanded in the vertical direction. Consequently, the far field pattern which is a Fourier transform of the near field pattern is restrained from expanding in the vertical direction, thus reducing a radiation angle $\theta\perp$ in the vertical direction.

Operation of the optical guide layer 11c to broaden a beam waist in the waveguide, to expand the region confining a beam therein, and to restrain the far field pattern from broadening in the vertical direction calls for setting a distances $t_{11c}$ from the active layer 12 to the optical guide layer 11c in excess of the preset value. For example, it is preferable to set the distance three times or more than the oscillation wavelength of the laser diode in a medium.

In the laser diode of the present embodiment, there is set up one optical guide layer which operates to broaden a beam waist in the waveguide only in a n-type cladding layer, but a plurality of optical guide layers operating to broaden a beam waist in the waveguide may be set up in the n-type cladding layer.

Figure 3:
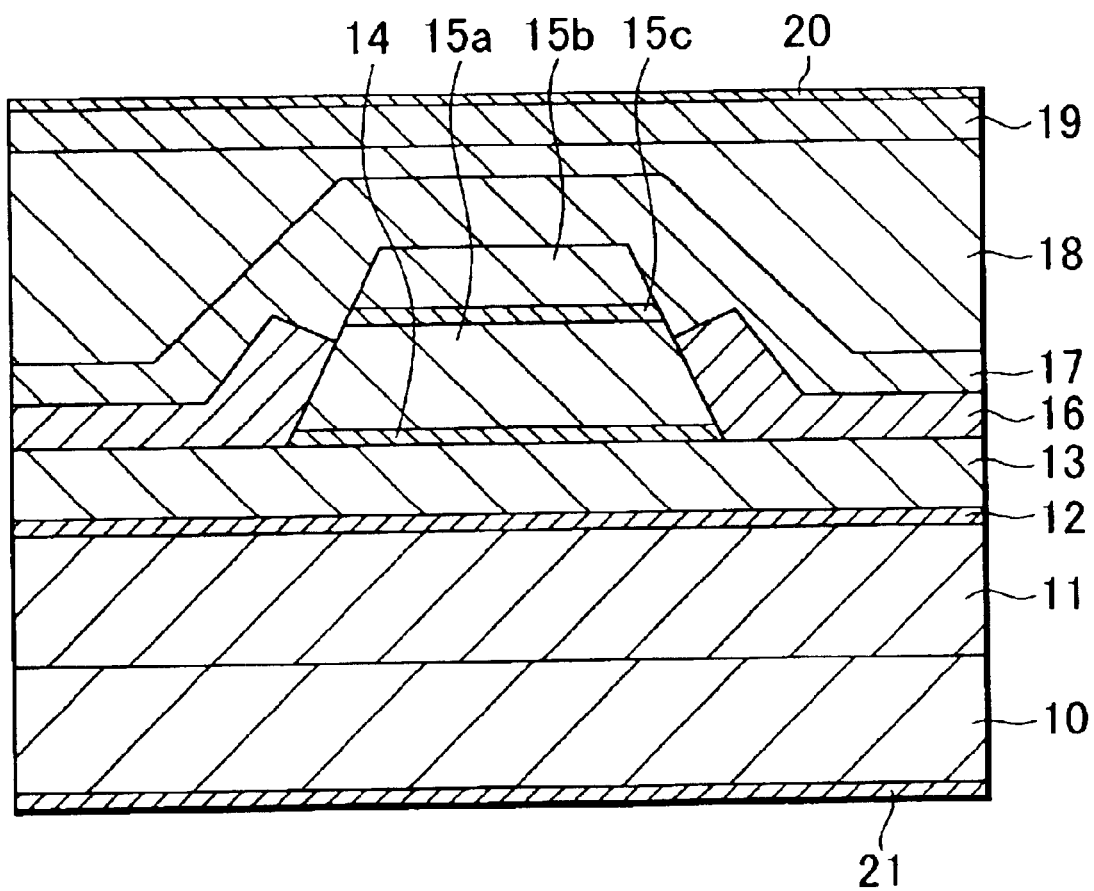
FIG. 3 is a cross-sectional view of a laser diode of a third embodiment according to the present invention.

Moreover, referring to FIG. 3 illustrating a cross-sectional view of a different construction of the laser diode of the present embodiment, there is shown a construction in which a p-type optical guide layer 15c is formed on the boundary of the p-type first cladding layers 15a, 15b. In this manner, there may be set up, only in the p-type cladding layer, one optical guide layer which operates to broaden a beam waist in the waveguide. Or, a plurality of optical guide layers operating to broaden a beam waist in the wave guide may be set up in the p-type cladding layer.

FIRST EXAMPLE

Figure 10:
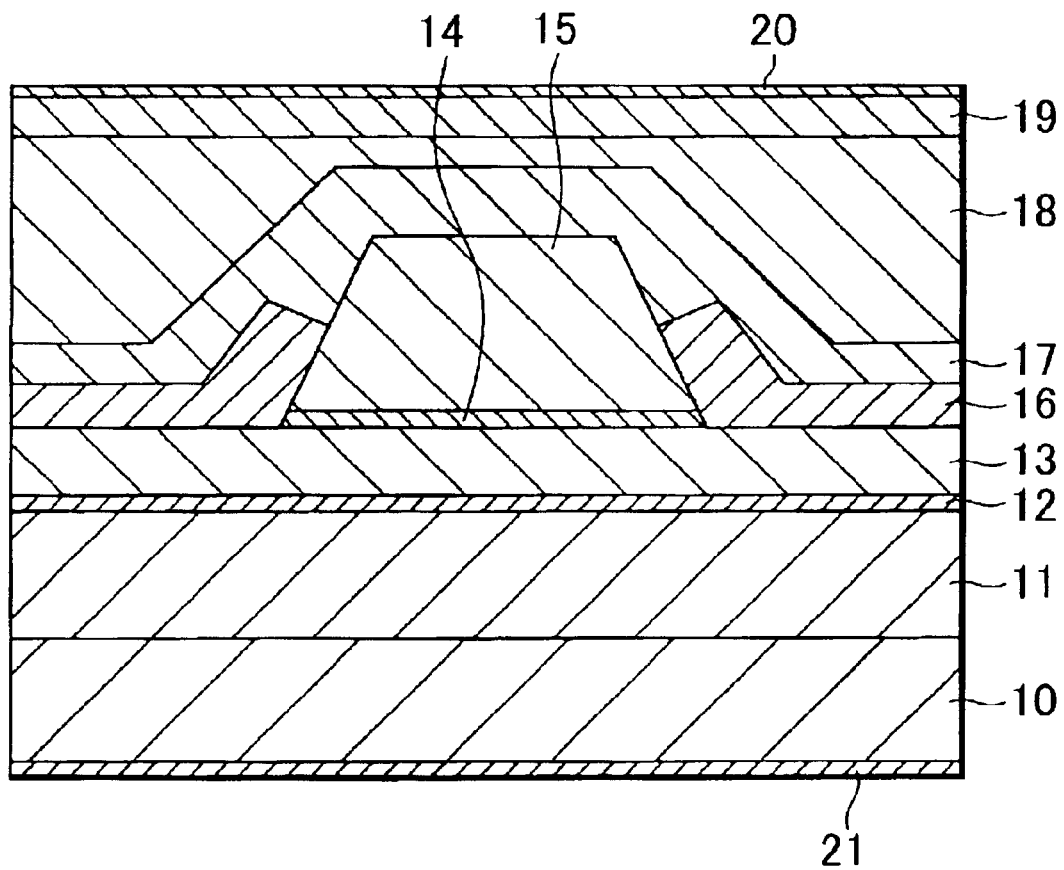
FIG. 10 is a cross-sectional view of a conventional laser diode.
Figure 10:
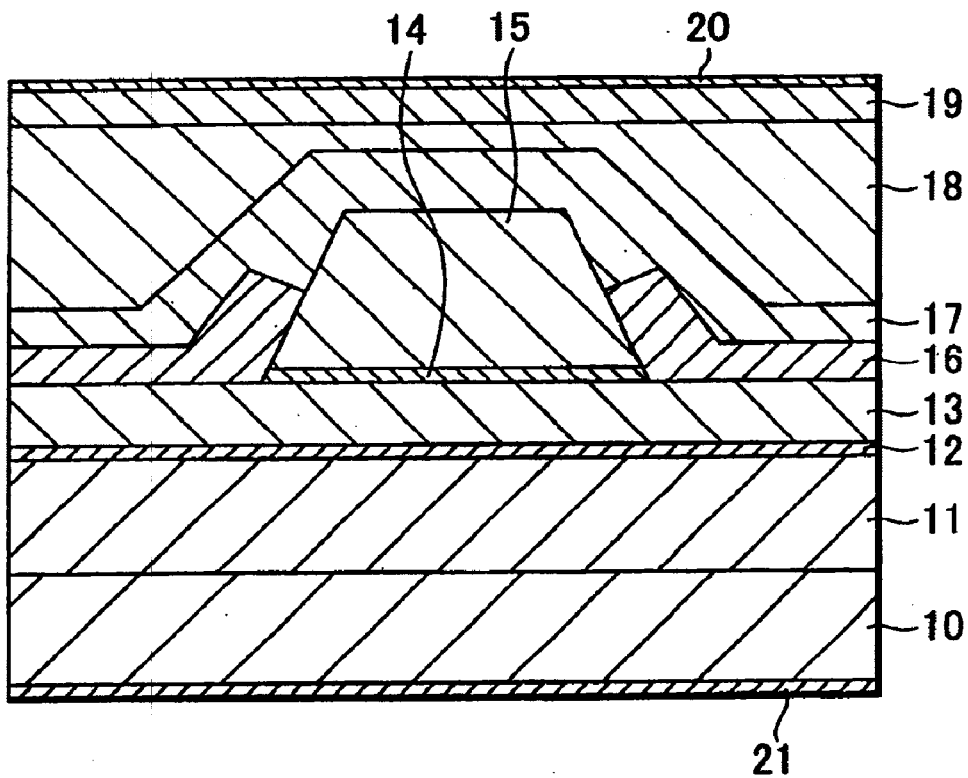

In regard to the laser diode according to a construction shown in FIG. 1 having, in the n-type cladding layer and in the p-type first cladding layer, respectively, optical guide layers which operate to broaden a beam waist in the waveguide, the laser diode according to a construction shown in FIG. 2 having, only in the n-type cladding layer, an optical guide layer which operates to broaden a beam waist in the waveguide, and the conventional laser diode shown in FIG. 10 having no optical guide layer which operates to broaden a beam waist in the waveguide, other conditions being constant than the presence of the optical guide layer which operates to broaden a beam waist in the waveguide, there were obtained in simulation each refractive index (n) profile and a corresponding optical intensity distribution in the vicinity of the radiating edge surface of the laser, that is, near field pattern.

Figure 4A:
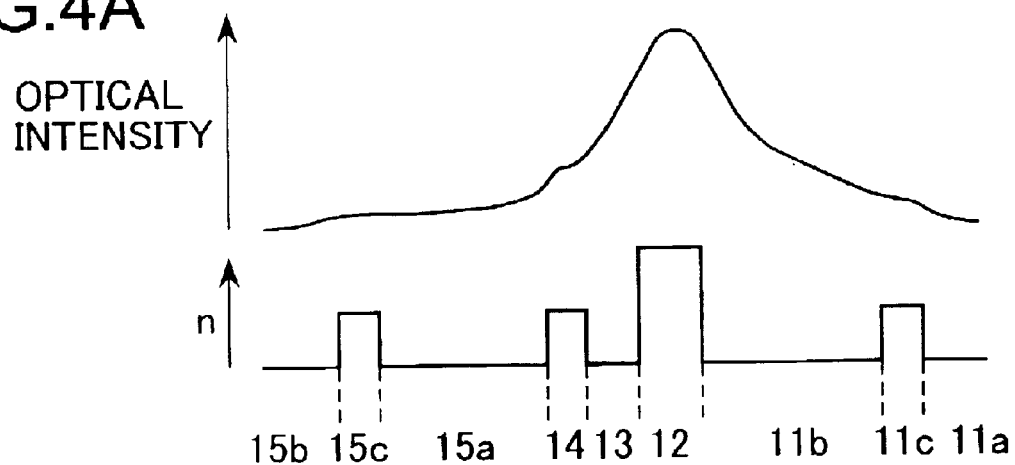
FIG. 4 shows refractive index profiles and near field patterns of laser diodes of a first example of the second embodiment according to the present invention.
Figure 4B:
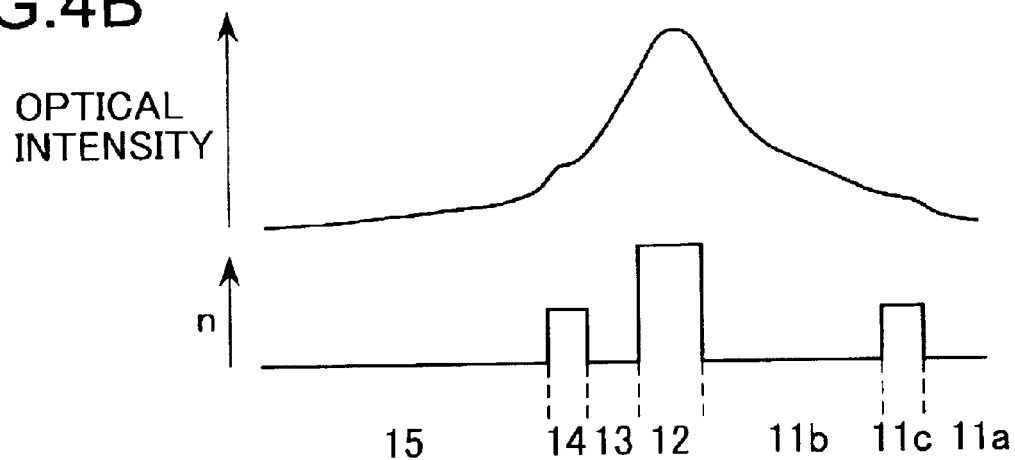
Figure 4C:
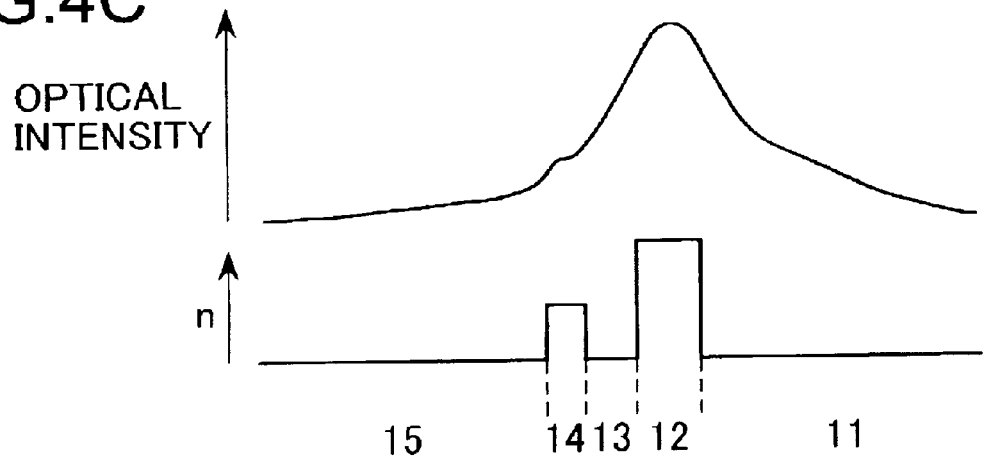

The results are shown in FIG. 4: FIG. 4A corresponds to the laser diode, construction of which is shown in FIG. 1; FIG. 4B corresponds to the laser diode, construction of which is shown in FIG. 2; and FIG. 4C corresponds to the laser diode, construction of which is shown in FIG. 10. The upper part of each graph shows an optical intensity distribution, while the lower part thereof shows a refractive index profile. Also, the numerals in FIG. 4A to FIG. 4C correspond to the reference numerals on each drawing of FIGS. 1, 2, and 9, indicating positions.

As compared with a case of FIG. 4C having, in both the n-type cladding layer and the p-type cladding layer, no optical guide layer which operates to broaden a beam waist in the waveguide, in a case of FIG. 4A having the optical guide layers, in both the n-type cladding layer and the p-type cladding layer, which operate to broaden a beam waist in the waveguide, and in a case of FIG. 4B having, only in the n-type cladding layer, the optical guide layer which operates to broaden a beam waist in the waveguide, since the optical intensity of each region corresponding to where each of the optical guide layers 11c, 15c was formed is strong, the near field pattern is broader than FIG. 4C.

SECOND EXAMPLE

Each of the near field patterns (NFP) of a first example was subjected to Fourier transformation and the optical intensity distribution far away from the radiating edge surface of the laser, that is, the far field pattern, corresponding to each case were obtained in simulation.

Figure 5A:
FIG. 5 shows far field patterns of laser diodes of a second example of the second embodiment according to the present invention.
Figure 5B:
Figure 5C:
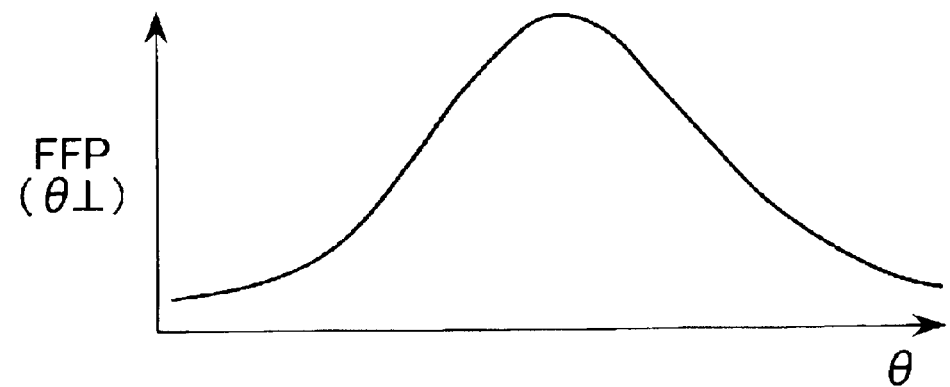

The results are shown in FIG. 5: FIG. 5A corresponds to the laser diode, construction of which is shown in FIG. 1; FIG. 5B corresponds to the laser diode, construction of which is shown in FIG. 2; and FIG. 5C corresponds to the laser diode, construction of which is shown in FIG. 10. Each graph shows an optical intensity distribution with respect to a radiating angle θ in the vertical direction.

It was found out that while the laser diodes of FIGS. 1 and 2 showed broader distributions than the laser diode of FIG. 10 in regard to the near field pattern, the laser diodes indicated narrower distributions than the laser diode of FIG. 10 in regard to the far field pattern and that the radiating angles θ⊥ in the vertical direction were reduced.

THIRD EXAMPLE

In the laser diodes shown in FIGS. 1 and 2 above, when a distance t from the active layer of the optical guide layer set up in the n-type cladding layer and in the p-type first cladding layer was varied, each radiating angle θ⊥ in the vertical direction was obtained in simulation. The composition of each optical guide layer was $Al_{0.3}Ga_{0.7}As$ with a film thickness of 50 nm.

Figure 6:
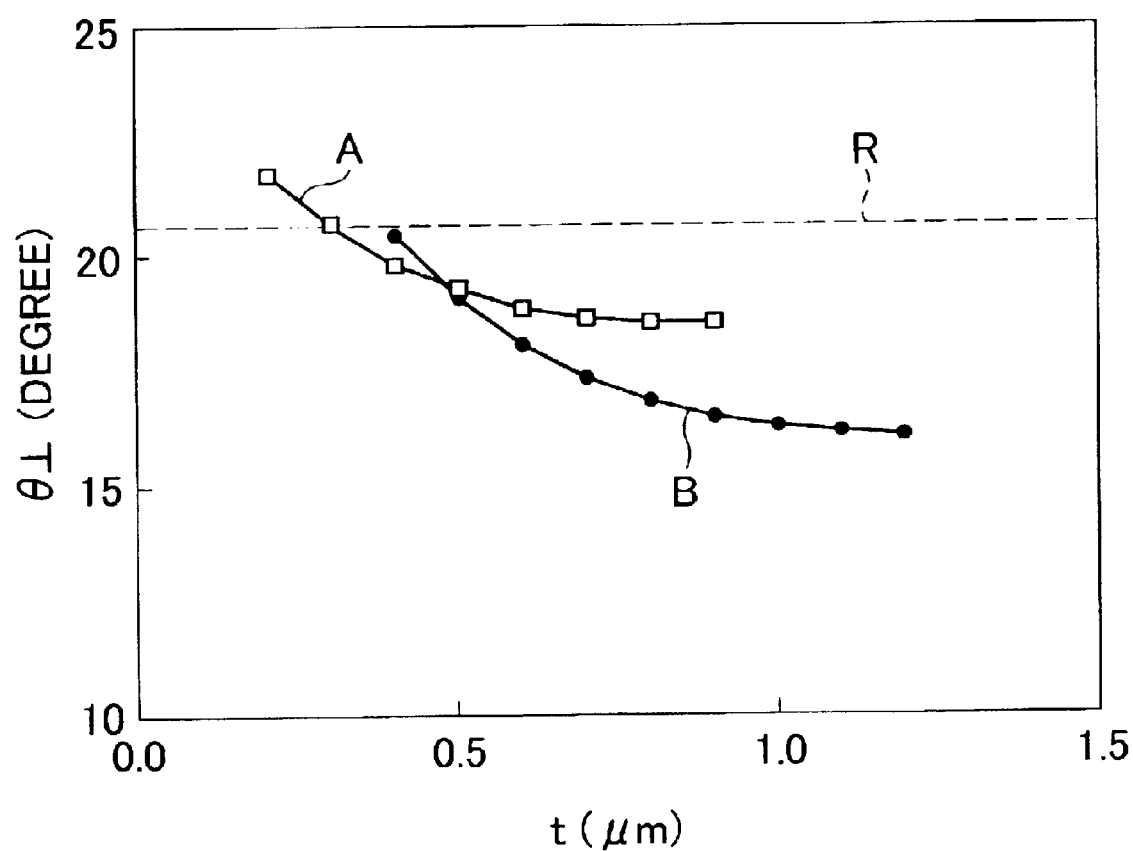
FIG. 6 shows relationships among optical guide layers, active layers, and distance dependency of radiating angles in the vertical direction of a third example of the second embodiment according to the present invention.

The results are shown in FIG. 6, in which R stands for a radiating angle θ⊥ in the vertical direction (approx. 21 degrees) of the laser diode having no optical guide layer which operates to broaden a beam waist in the waveguide in accordance with a construction shown in FIG. 10.

A in FIG. 6 indicates, in the laser diode of a construction of the present invention shown in FIG. 2, is a radiating angle θ⊥ in the vertical direction, when a distance t from the active layer of the optical guide layer set up in the n-type cladding layer is varied. If the optical guide layer on the n-type cladding layer is formed in a range farther than approx. 0.3 μm from the active layer, the radiating angle θ⊥ in the vertical direction is caused to contract from the R value, indicating that the optical guide layer in the n-type cladding layer operates to broaden a beam waist in the waveguide.

The farther away the optical layer is formed from the active layer, the smaller the radiating angle θ⊥ in the vertical direction becomes, but when t is on the order of 0.8 μm, the radiating angle θ⊥ in the vertical direction becomes approx. 18 degrees and reaches the upper limit. On the other hand, in a range closer than 0.3 μm from the active layer, the radiating angle θ⊥ in the vertical direction is caused to expand, indicating that in a case of being closer than 0.3 μm, the optical guide layer produces waveguide operation which further narrows a region in which to confine a beam.

B in FIG. 6 indicates, in the laser diode of a construction of the present invention in FIG. 1, is a radiating angle θ⊥ in the vertical direction, when a distance from the active layer of the optical guide layer in the n-type cladding layer is fixed at 0.8 μm and a distance t from the active layer of the optical guide layer in the p-type first cladding layer is varied. In regard to the optical guide layer in the p-type first cladding layer, too, if it is formed far from the active layer, the radiating angle θ⊥ in the vertical direction is caused to contract, and the radiating angle θ⊥ in the vertical direction reaches approx. 16 degrees. Conversely, if it is brought nearer, the radiating angle θ⊥ in the vertical direction is caused to expand.

For example, to obtain a required radiating angle θ⊥ in the vertical direction on an CD-R/RW application, it is preferable to make the distance t from the active layer of the optical guide layer in the p-type first cladding layer three times or more than an oscillation wavelength in a medium. Namely, in a case where an oscillation wavelength is 780 nm with a refractive index of a medium n=4, three times the oscillation wavelength in a medium (780 nm/4) is approx. 0.6 μm, whereas setting a distance t from the active layer of the optical guide layer in the n-type cladding layer or in the p-type first cladding layer in excess of this value makes it possible to obtain the required radiating angle θ⊥ in the vertical direction.

Third Embodiment

The laser diode of the present invention is installed in a device according to the present embodiment, which is an optical pickup device to be mounted in an optical disk apparatus for recording on or reproducing from an optical disk.

Figure 7:
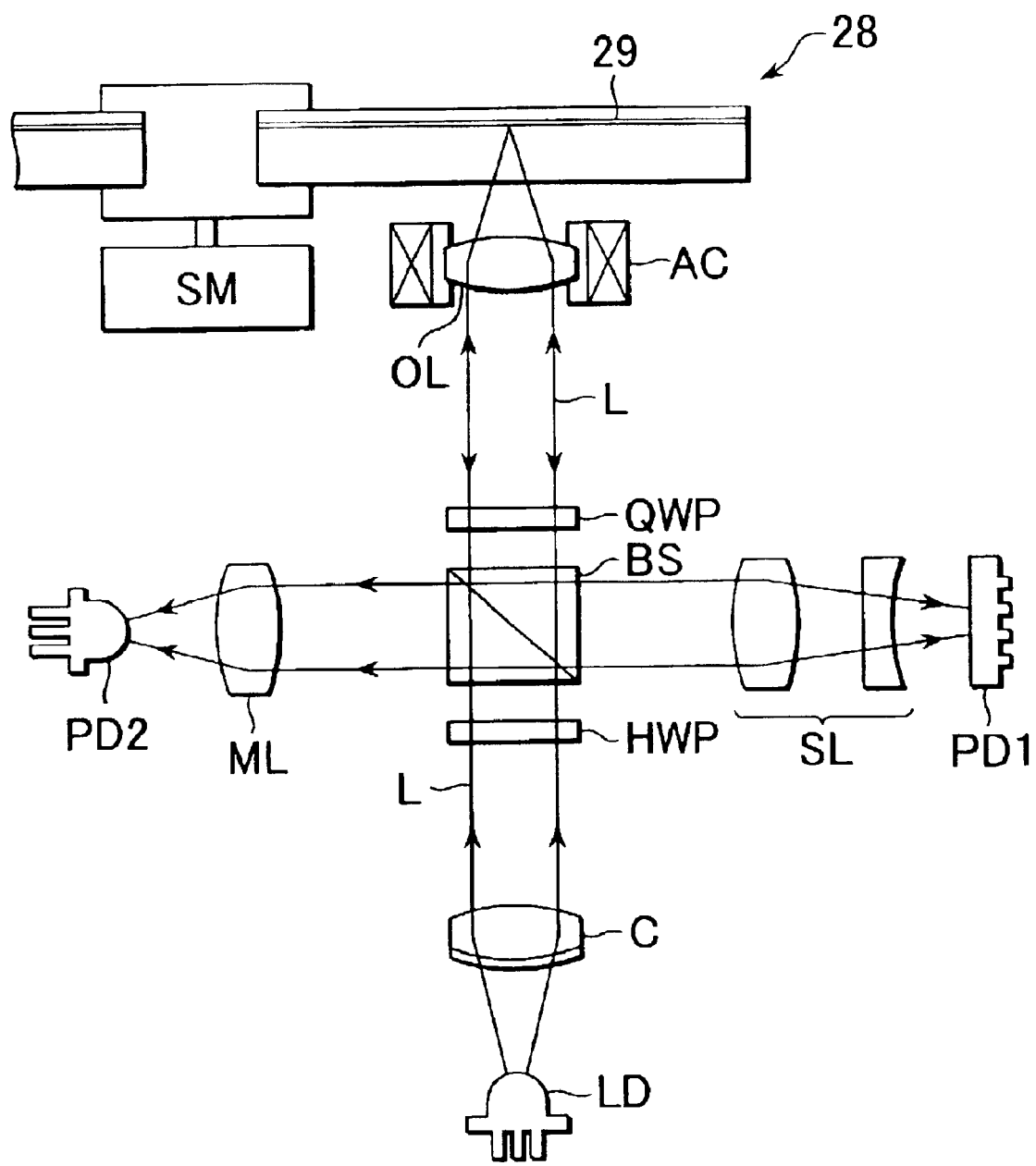
FIG. 7 is a schematic representation of an optical pickup device of the third embodiment according to the present invention.

FIG. 7 is a schematic illustration of the optical pickup device. For example, with respect to an optical disk 28 revolvingly driven by a spindle motor SM, there are placed at respective preset positions a laser diode LD, a collimator C, a half wavelength plate HWP, a beam splitter BS, a quarter wavelength plate QWP, an object lens attached to an electromagnetic actuator AC, a servo and an optical lens SL for RF, a first photodiode PD1, a monitor lens ML, and a second photodiode PD2. The laser diode LD is a laser diode described in a first embodiment or a second embodiment, its radiating angle θ⊥ in the vertical direction being contracted to reduce an aspect ratio of a laser beam.

After a laser beam L emitted from the laser diode LD is made by the collimator C into parallel beams, passing through the half wavelength plate HWP to be incident on a beam splitter BS, whereupon, in the beam splitter BS, the incident beam passes, excepting part of it, and, via the quarter wavelength plate QWP, it is condensed by the object lens OL, irradiating an optical recording layer 29 of the optical disk 28 which is revolvingly driven by the spindle motor SM.

A reflected light L (reflecting beam) from the optical recording layer 29 of the optical disk 28 follows a route reverse to the incident route, enters the beam splitter BS, reflects on a spectral face, to be condensed by the servo and the optical lens SL for RF, and further enters the first photodiode PD1 to be subjected to observation.

On the other hand, part of the laser beam L emitted from the laser diode LD reflects on the spectral face of the beam splitter BS to be condensed by the monitor lens ML, entering the second photodiode PD2, thereafter the intensity of the laser beam is monitored.

Since a laser diode with a contracted θ⊥ is mounted in the optical pickup device, the pickup device is capable of improving coupling efficiency with an optical system and diminishing any loss component not conducive to optical coupling. For example, it is well suited for use in an optical disk apparatus such as a CD-R/RW that requires a high-speed write operation, enabling high-speed recording with low power consumption.

Fourth Embodiment

The laser diode of the present invention is also provided in an apparatus according to the present embodiment, which is an optical disk apparatus recording on or reproducing from an optical disk.

Figure 8:
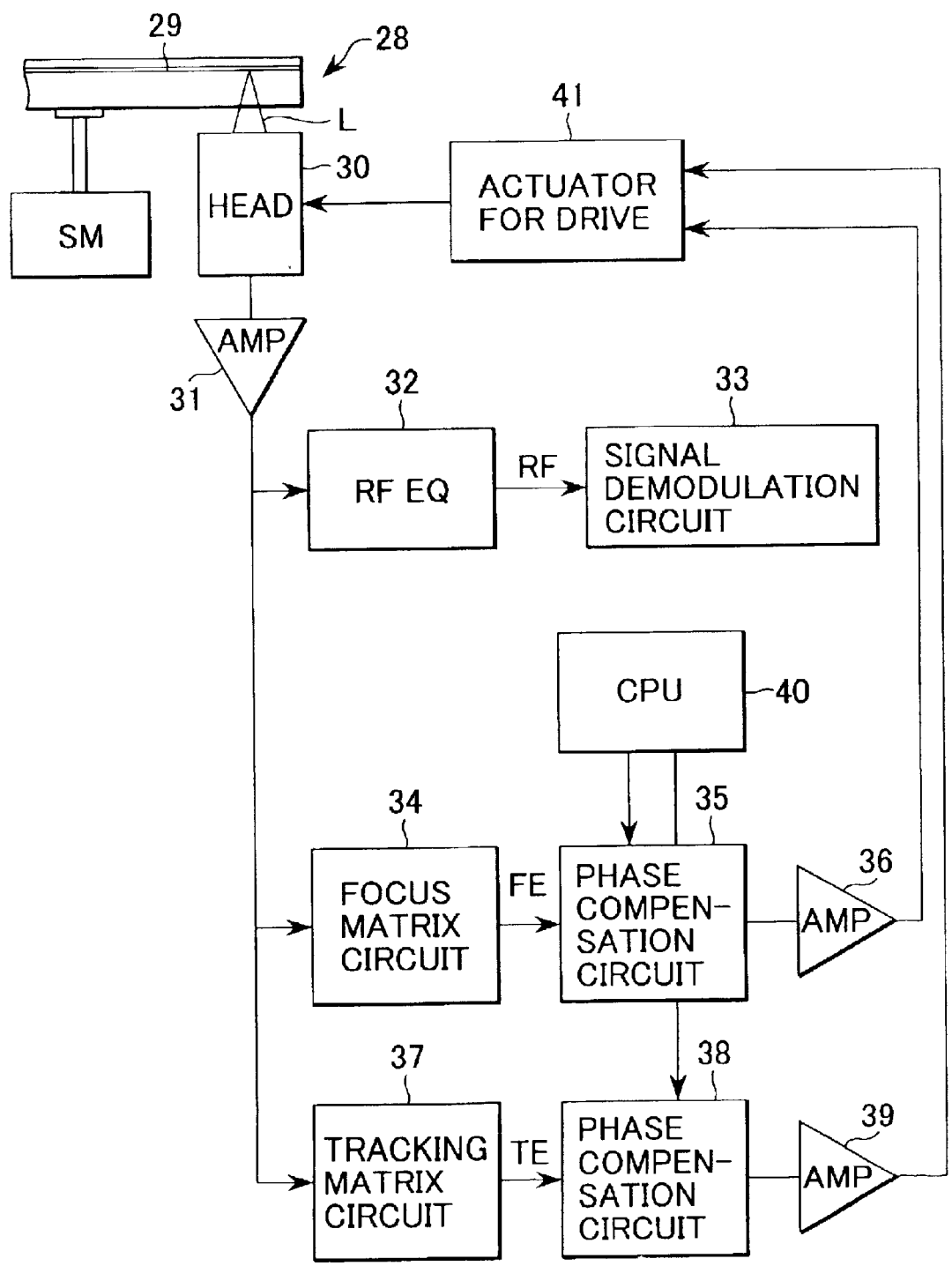
FIG. 8 is a schematic representation of an optical disk apparatus of a fourth embodiment according to the present invention.

FIG. 8 is a schematic illustration of the optical disk apparatus. A laser beam L from the optical pickup device (head) 30 is incident on an optical recording layer 29 of an optical disk 28 which is revolvingly driven by a spindle motor SM, then, its reflecting beam (reflected light) is detected to produce reproduced signals, whereas the signals are inputted into a head amplifier 31 provided for the purpose of amplifying the reproduced signals from the head 30 to a preset level that is necessary for processing at a later stage.

The reproduced signals amplified in the head amplifier 31 are inputted into an RF equalizer amplifier 32, a focus matrix circuit 34, a tracking matrix circuit 36, and the like.

In the RF equalizer amplifier 32, a preset arithmetic operation based on the inputted reproduced signals is performed, and RF signals (RF) obtained are inputted into a signal demodulation circuit 33, where the signals are subjected to signal processing as reproduced signals of information recorded on the optical disk 28.

In the focus matrix circuit 37, a preset arithmetic operation is performed based on the inputted reproduced signals, and focus error signals (FE) obtained are phase compensated by a phase compensation circuit 35, whereupon, after the FE signals are amplified by the amplifier 36, they are inputted into an actuator 41 for drive.

In the tracking matrix circuit 37, a preset arithmetic operation is performed based on the inputted reproduced signals, and tracking error signals (TE) obtained are phase compensated by a phase compensation circuit 38, whereupon, after the TE signals are amplified by an amplifier 39, they are inputted into the actuator 41 for drive.

In the actuator 41 for drive, the position of an object lens in the head 30 is adjusted based on the inputted FE signals and the TE signals, and adjustments of focusing and tracking of the laser beam L are carried out.

By means of the focus servo and tracking servo described above, a beam can be accurately irradiated on the optical recording layer of the optical disk 28, so that by detecting a reflected light thereof, it is possible to read out data recorded on the optical disk 28 and output read-out data as reproduced signals.

A CPU (Central Processing Unit) 40 controls operation of the entire optical disk apparatus such as servo mechanism and other mechanisms.

A laser diode to be mounted in the optical pickup device (head) 30 is the laser diode described in a first or a second embodiment, its radiating angle $\theta\perp$ in the vertical direction being contracted to reduce the aspect ratio of a laser beam, wherefore it is possible to improve the coupling efficiency of a laser beam emitted by the laser diode and an optical system, so that any loss component not conducive to optical coupling can be reduced.

For example, this is well suited for use in an optical disk device such as CD-R/RW that that requires a high-speed write operation, enabling high-speed recording with low power consumption.

Fifth Embodiment

Figure 9:
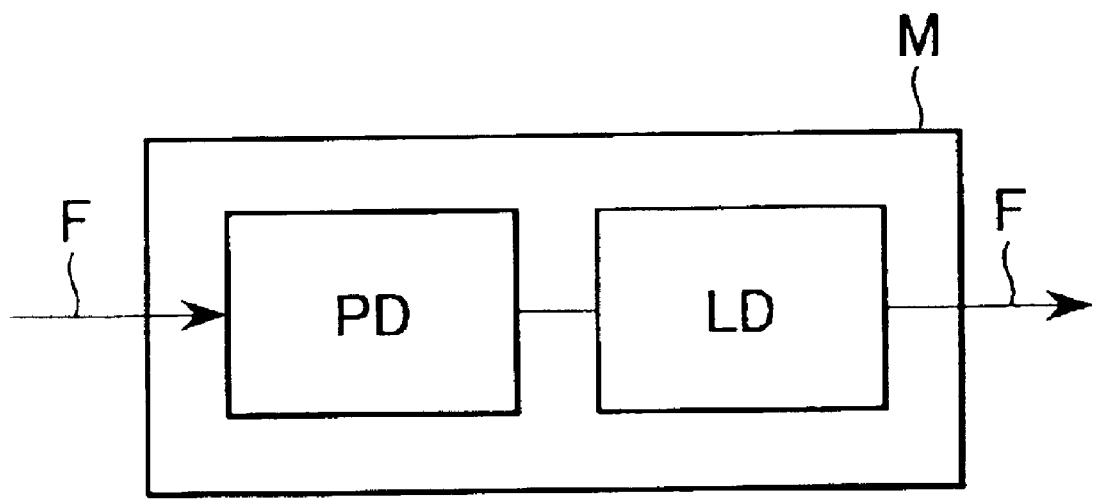
FIG. 9 is a schematic representation of an optical communications module of a fifth embodiment according to the present invention.

FIG. 9 schematically shows another apparatus mounted with the laser diode according to the present embodiment, which is an optical communications module.

An optical communications module M has a photodiode PD and a laser diode LD built therein. For example, optical signals are externally inputted through an optical fiber F to the photodiode PD, and converted to electrical signals to be transmitted to the laser diode LD. The laser diode LD to which electrical signals are transmitted emits optical signals as a laser beam to be outputted externally through the optical fiber F.

The laser diode described above is the laser diode described in a first embodiment or a second embodiment, its radiating angle $\theta\perp$ in the vertical direction being contracted to reduce the aspect ratio of a laser beam. Consequently, it is possible to improve the coupling efficiency of a laser beam emitted by the laser diode and an optical system, so that any loss component not conducive to optical coupling can be reduced, enabling high-speed long distance communications to be achieved.

The present invention having been described is not limited to the disclosed five embodiments but may be modified further in still other ways without departing from the spirit and scope of the invention. For example, description of the laser diode was made in regard to the ridge embedded laser diode of the AlGaAs type. This is applicable, for example, to a laser diode for an optical disk such as the AlGaInP type and the GaN type as well as a laser diode for communications such as the InGaAs type and the GaInNAs type.

Further, it is possible to select, as necessary, semiconductor materials and metallic materials constituting the laser diode as well as their film thickness. In addition, it is possible to make various changes or modifications within a range of not departing from the spirit and scope of the present invention.

It is a feature and advantage of the laser diode according to the present invention that its operation to broaden a beam waist in the waveguide of the optical guide layer is conducive to expanding a region confining a beam therein, thereby expanding the near field pattern in the vertical direction, restricting its Fourier transform, that is, the far field pattern, from expanding in the vertical direction, and reducing a radiating angle $\theta\perp$ in the vertical direction.

Since installation of the laser diode of the present invention leads to reducing the radiating angle $\theta\perp$ in the vertical direction of an emitted laser beam, it is possible to improve coupling efficiency with an optical system in an optical pickup device, optical disk apparatus, and optical communications equipment, thus reducing any loss component not conducive to optical coupling.

Embodiments described herein are illustrative and not restrictive. The scope of the invention is shown by appended claims, and all changes and modifications that fall within the meaning of these claims are contained in the present invention.

What is claimed is:

1. A laser diode comprising:
   a first cladding layer of a first conductive type formed on a substrate;
   an active layer formed on said first cladding layer;
   a second cladding layer of a second conductive type formed on a top layer of said active layer; and
   at least one optical guide within one of said first cladding layer and said second cladding layer, said optical guide layer having a higher refractive index than said first cladding layer or second cladding layer and operating to broaden a beam waist in a waveguide, said optical guide layer being sandwiched between portions of said first cladding layer or said second cladding layer.

2. The laser diode according to claim 1, wherein said optical guide layer is formed in said first cladding layer.

3. The laser diode according to claim 1, wherein a plurality of optical guide layers are formed in said first cladding layer as said optical guide layer.

4. The laser diode according to claim 1, wherein said optical guide layer is formed in said second cladding layer.

5. The laser diode according to claim 4, wherein said second cladding layer has a ridge shape portion and said optical guide layer is formed on the ridge shape portion of said second cladding layer.

6. The laser diode according to claim 1, wherein a plurality of optical guide layers are formed in said second cladding layer as said optical guide layer.

7. The laser diode according to claim 6, wherein said second cladding layer has a ridge shape portion and at least one of said plurality of optical guide layer is formed on the ridge shape portion of said second cladding layer.

8. The laser diode according to claim 1, wherein, as said optical guide layer, at least one optical guide layer is formed in said first cladding layer and at least one optical guide layer is formed in said second cladding layer.

9. The laser diode according to claim 8, wherein a plurality of optical guide layers are formed in said first cladding layer as said optical guide layer.

10. The laser diode according to claim 8, wherein said second cladding layer has a ridge shape portion and said optical guide layer formed in said second cladding layer is formed on the ridge shape portion thereof.

11. The laser diode according to claim 8, wherein a plurality of optical guide layers are formed in said second cladding layer as said optical guide layer.

12. The laser diode according to claim 11, wherein said second cladding layer has a ridge shape portion and at least one of said plurality of optical guide layers is formed on the ridge shape portion thereof.

13. The laser diode according to claim 1, wherein a distance from said optical guide layer to said active layer is three times or more than an oscillation wavelength of said laser diode in a medium.

14. The laser diode according to claim 1, wherein said second cladding layer has a ridge shape portion and a current block layer is formed on both sides of said ridge shape portion.

15. The laser diode according to claim 1, wherein said active layer comprises a quantum well structure including a well layer as well as a barrier layer, and a SCH (Separated Confinement Hetero) optical guide layer formed on said first cladding layer side and second cladding layer side of said quantum well structure.

16. The laser diode according to claim 1, wherein a following equation (1) holds:

$$(n_1/n_0) - 1 \geq 1/d_1 \qquad (1)$$

where $n_0$ is a refractive index of said first cladding layer, $n_1$ is a refractive index of said optical guide layer, and $d_1$ is a film thickness.

17. The laser diode according to claim 3, wherein, as said plurality of optical guide layers, optical guide layers from the first to the j-th are formed in said first cladding layer and a following equation (2) holds:

$$\sum_{i=1}^{j} ((n_i/n_0) - 1) \times d_i \geq 1 \qquad (2)$$

where $n_0$ is a refractive index of said first cladding layer, $n_i$ is a refractive index of the i-th optical guide layer in the plurality of optical guide layers from the first to the j-th formed in said first cladding layer, and $d_i$ is a film thickness.

18. The laser diode according to claim 17, wherein the refractive indexes in said first cladding layer including the optical guide layers from the first to the j-th are gradually distributed.

19. The laser diode according to claim 4, wherein the following equation (1) holds:

$$(n_1/n) - 1 \geq 1/d_1 \qquad (1)$$

where $n_0$ is a refractive index of said second cladding layer, $n_1$ is a refractive index of said optical guide layer, and $d_1$ is a film thickness.

20. The laser diode according to claim 6, wherein, as said plurality of optical guide layers, optical guide layers from the first to the j-th are formed in said second cladding layer and the following equation (2) holds:

$$\sum_{i=1}^{j} ((n_i/n_0) - 1) \times d_i \geq 1 \qquad (2)$$

where $n_0$ is a refractive index of said second cladding layer, $n_i$ is a refractive index of the i-th optical guide layer in the plurality of optical guide layers from the first to the j-th formed in said second cladding layer, and $d_i$ is a film thickness.

21. The laser diode according to claim 20, wherein the refractive indexes in said second cladding layer including the optical guide layers from the first to the j-th are gradually distributed.

22. The laser diode according to claim 1, wherein said first cladding layer is of an n-type and said second cladding layer is of a p-type.

23. The laser diode according to claim 1, wherein said first cladding layer is of a p-type and said second cladding layer is of an n-type.

24. The laser diode according to claim 15, wherein Al composition ratios of the barrier layer in said active layer, said SCH optical guide layer, and the optical guide layer operating to broaden the beam waist in the waveguide are virtually equal.

25. The laser diode according to claim 1, wherein an optical guide layer having a higher refractive index than said second cladding layer and virtually not operating to broaden the beam waist in the waveguide is further formed in said second cladding layer.

26. The laser diode according to claim 25, wherein a distance from said active layer to said current block layer is less than a distance from said active layer to the optical guide layer bringing about virtually no operation to broaden the beam waist in the waveguide.

27. An optical pickup device comprising:
a laser diode including, as a light-emitting unit transmitting light to irradiate an optical recording layer of an optical recording medium;
a first cladding layer of a first conductive type formed on a substrate;
an active layer formed on a top layer of said first cladding layer;
a second cladding layer of a second conductive type formed on a top layer of said active layer; and
at least one optical guide within one of said first cladding layer and said second cladding layer, said optical guide layer having a higher refractive index than said first cladding layer or second cladding layer and operating to broaden a beam waist in a waveguide, said optical guide layer being sandwiched between portions of said first cladding layer and said second cladding layer.

28. An optical disk apparatus comprising:
a laser diode including, as a light-emitting unit transmitting light to irradiate an optical recording layer of an optical recording medium which is revolvingly driven;
a first cladding layer of the first conductive type formed on a substrate;
an active layer formed on the top layer of said first cladding layer;
a second cladding layer of the second conductive type formed on the top layer of said active layer; and
at least one optical guide within one of said first cladding layer and said second cladding layer, said optical guide layer having a refractive index higher than said first cladding layer or second cladding layer and operating to broaden a beam waist in the waveguide, said optical guide layer being sandwiched between portions of said first cladding layer and said second cladding layer.

29. Light communications equipment, which is optical communications equipment consisting essentially of at least a light-emitting unit transmitting light and an optical transmission system optically connected to said light-emitting section, comprising:

a laser diode including a first cladding layer of the first conductive type formed on a substrate;

an active layer formed on the top layer of said first cladding layer;

a second cladding layer of the second conductive type formed on the top layer of said active layer; and at least one optical guide within one of said first cladding layer and said second cladding layer, said optical guide layer having a higher refractive index than said first cladding layer or second cladding layer and operating to broaden a beam waist in the waveguide, said optical guide layer being sandwiched between portions of said first cladding layer and said second cladding layer.

* * * * *

UNITED STATES PATENT AND TRADEMARK OFFICE
CERTIFICATE OF CORRECTION

PATENT NO. : 6,879,613 B2
DATED : April 12, 2005
INVENTOR(S) : Kanji Takeuchi and Kenji Sahara It is certified that error appears in the above-identified patent and that said Letters Patent is hereby corrected as shown below:

Drawings,
Sheet 10 of 10, "Fig. 10", replace with new Fig. 10 labeled -- Prior Art --.

Signed and Sealed this

Twenty-third Day of August, 2005

JON W. DUDAS
*Director of the United States Patent and Trademark Office*

PRIOR ART